(12) United States Patent
Beck et al.

(10) Patent No.: US 7,306,670 B2
(45) Date of Patent: Dec. 11, 2007

(54) METHOD FOR PRODUCING MONOCRYSTALLINE STRUCTURES

(75) Inventors: Thomas Beck, Zepernick (DE); Georg Bostanjoglo, Berlin (DE); Nigel-Philip Cox, Berlin (DE); Rolf Wilkenhöner, Berlin (DE)

(73) Assignee: Siemens Aktiengesellschaft, Muenchen (DE)

( * ) Notice: Subject to any disclaimer, the term of this patent is extended or adjusted under 35 U.S.C. 154(b) by 71 days.

(21) Appl. No.: 10/729,201

(22) Filed: Dec. 5, 2003

(65) Prior Publication Data

US 2004/0112280 A1    Jun. 17, 2004

Related U.S. Application Data

(63) Continuation of application No. PCT/DE03/00952, filed on Mar. 21, 2003.

(30) Foreign Application Priority Data

Apr. 15, 2002   (DE) ............... 102 16 662
Sep. 19, 2002   (DE) ............... 102 43 558

(51) Int. Cl.
   *C30B 13/00*   (2006.01)

(52) U.S. Cl. ............ 117/3; 117/9; 117/11; 117/37; 117/904; 117/905; 117/939

(58) Field of Classification Search .......... 117/3, 117/9, 11, 37, 904, 905, 939
See application file for complete search history.

(56) References Cited

U.S. PATENT DOCUMENTS 4,177,372 A * 12/1979 Kotera et al. ................ 117/39
4,707,217 A    11/1987 Aklufi
4,832,982 A     5/1989 Mori et al.
4,878,953 A * 11/1989 Saltzman et al. ............ 148/512
5,106,010 A *  4/1992 Stueber et al. .............. 228/232
5,312,584 A *  5/1994 Frasier et al. ................ 419/47
5,640,767 A *  6/1997 Jackson et al. ........ 29/889.721
6,024,792 A *  2/2000 Kurz et al. ..................... 117/9
6,103,402 A *  8/2000 Marcin et al. ............... 428/637
6,333,484 B1* 12/2001 Foster et al. ........... 219/121.64
6,405,435 B1*  6/2002 Konter et al. ............... 29/889.7

FOREIGN PATENT DOCUMENTS

EP    0 740 977 A1    11/1996
EP    0 861 927 A1     9/1998
EP    1 065 026 A1     1/2001

OTHER PUBLICATIONS

Sen Yang, Weidong Huang, Wenjin Liu, Yaohe Zhou, Effects of crystal orientation on microstructure of molten pool in laser rapidly solidified DD2 single crystal, Journal of Materials Science Letters 21, 2002, 1-6.

* cited by examiner

Primary Examiner—Yogendra N. Gupta
Assistant Examiner—Matthew J. Song

(57) ABSTRACT

In the case of the epitaxial growth according to the prior art, a number o strips often have to be produced in a plane in order to restore an area to be repaired. This leads to overlapping and misorientation of the crystalline structures. In the case of the method according to the invention, the strip is of such a width that no overlapping occurs, since the width is adapted to the contour of the area to be repaired.

17 Claims, 3 Drawing Sheets

METHOD FOR PRODUCING MONOCRYSTALLINE STRUCTURES

CROSS REFERENCE TO RELATED APPLICATIONS

This application is a continuation of International Application No. PCT/DE03/00952, filed Mar. 21, 2003 and claims the benefit thereof. The International Application claims the benefits of German application No. 10216662.5, filed Apr. 15, 2002, and of German application No. 10243558.8 filed Sep. 19, 2002, all three of the applications are incorporated by reference herein in their entirety.

FIELD OF INVENTION

The invention relates to a method for producing directionally solidified and monocrystalline structures, in particular from superalloys, according to the precharacterizing clause of the independent claim 1.

BACKGROUND OF INVENTION

Metallic workpieces with a monocrystalline structure or structures are used as components of machines which are exposed to high mechanical, thermal and/or chemical loads during operation. For example, blades of gas turbines, in particular including those of rotors for aircraft engines, but also those for stationary gas turbines, are produced from monocrystals.

The fabrication of such monocrystalline workpieces takes place for example by directional solidification from the melt. This involves casting methods in which the liquid metal alloy solidifies to form the monocrystalline structure, i.e. to form the monocrystalline workpiece, or directed.

Known for example is a special casting method for producing such workpieces in which the liquid alloy located in a ceramic mold is given a crystallographic orientation in a directional temperature field, for example of a Bridgeman furnace. In this case, dendritic crystals are oriented along the heat flux and form either a columnar grain structure (i.e. grains which extend over the length of the workpiece and are referred to here, in accordance with the terminology generally used, as directionally solidified) or a monocrystalline structure, i.e. the entire workpiece comprises a single crystal.

In these methods, the transition to globulitic (polycrystalline) solidification must be avoided, since this non-directional growth necessarily forms transverse and longitudinal grain boundaries, which nullify the good properties of the directionally solidified or monocrystalline component. When reference is made in the present document to a monocrystalline structure or to monocrystalline structures, this both monocrystals which have no grain boundaries and also crystal structures, which indeed have grain boundaries which extend longitudinally but no grain boundaries which extend in the transversal direction. These second-mentioned crystalline structures are also referred to as directionally solidified structures.

When reference is made generally to directionally solidified structures, this means both monocrystals, which have no grain boundaries or at most small-angle grain boundaries, and columnar structures, which indeed have grain boundaries extending in the longitudinal direction but no transversal grain boundaries.

Among the alloys used for example for the monocrystal turbine blades mentioned are so-called superalloys on a nickel (Ni), cobalt (Co) or iron (Fe) basis. Nickel-based superalloys in particular have outstanding mechanical and chemical high-temperature properties.

Such components become worn and damaged during use, but can be regenerated by removing the affected areas, if necessary, and reapplying the material in these areas (for example epitaxially). However, when doing so, it is intended that the same crystal structure is achieved.

Such a method is shown in U.S. Pat. No. 6,024,792 and in EP 0 892 090 A1.

In the case of this method, a layer of the material to be applied is applied transversely in relation to the length of the surface to be treated, in each case in narrow adjacent strips which correspond the area of the surface to be treated. This results in overlapping or touching of individual weld beads (strips on which new material adjacently grows), which because of the geometrical conditions lead to non-epitaxial growth with insufficient crystal orientation.

As a consequence, mechanical properties are inadequate.

SUMMARY OF INVENTION

It is therefore an object of the invention to overcome the aforementioned disadvantage.

The object is achieved by a method according to claim 1.

With the novel method it is possible to build up in a strip on the structure of a substrate, for example a directionally solidified structure of a substrate, one or more layers, or else a body or workpiece, with the same directionally solidified structure as the substrate. This is an epitaxial method (epitaxial is the term used for identically oriented crystal growth on a crystalline substrate), in which the directional crystalline structure of the substrate is adopted by the layer or the layers which are built up. In this case, a globulitic structure must be avoided by corresponding process control.

The invention provides a novel method by which it is possible to build up on a substrate with a monocrystalline structure or monocrystalline structures one or more layers, or else a body or a workpiece, with a monocrystalline structure. It is an epitaxial method in which the crystalline structure of the substrate is adopted by the layer or the layers which are built up.

There was previously no possibility for repairing or reconditioning a monocrystalline workpiece in such a way that the monocrystalline structure of the base material is also present in the reconditioned location, without many undesired crystal orientations occurring as a result.

With the novel method it is now possible to recondition damaged and worn monocrystalline workpieces in a monocrystalline manner, i.e. to add to and rebuild the optimum crystal structure. In this case, layers are progressively built up one by one in a monocrytalline manner on the substrate, for example in the case of a monocrystalline rotor blade, on a strip until the original size and form of the workpiece is achieved again. Passing in the longitudinal direction over the surface of the workpiece to be treated respectively takes place in this case in a single continuous path, that is to say without meandering cross-movements, to create narrow individual weld beads overlapping in the longitudinal direction.

The method for building up monocrystals from the same material as the substrate, approximately the same material or different materials, makes it possible for example to newly build up or add to workpieces which have monocrystalline structures and are damaged or worn. For example, today there are rotor blades of gas turbines which comprise single crystals of so-called metal superalloys and can be repaired by the method if they are damaged.

Monocrystalline workpieces can indeed be produced from the melt by so-called directional solidification. But even such parts produced with directional solidification become worn.

With the novel method it is now also possible to recondition damaged and worn monocrystalline workpieces in a monocrystalline manner, i.e. to add to and newly up the crystal structure. In this case, layers are progressively built up one by one in a monocrytalline manner on the substrate, for example in the case of a monocrystalline rotor blade, until the original size and form of the workpiece is achieved again.

Laser beams or electron beams, that is to say energy sources with which it is possible to introduce great amounts of energy on a large surface area, or in a large volume, are suitable as the energy or heat source for carrying out the method.

The beam of high energy and energy density is directed at the surface of the substrate, so that a surface layer of the substrate begins to melt slightly. The material is fed to the working area of the beam, for example in powder form or in the form of a wire. The fed material is likewise melted. The melting of the fed material may take place in the liquid pool of the molten surface layer or already on the way to the liquid pool. The process preferably takes place under inert gas and/or in a vacuum.

When the solidifying of the melt then proceeds under conditions which are outside the globulitic range, that is to say in the range in which the material used directionally solidifies, the material solidifies in a monocrystalline form, that is to say it grows as an epitaxial structure on the substrate. In the case of metals, globulitic solidification is the term used if the melt crystallizes in an a non-directional manner. During the transition from "directionally monocrystalline" to "non-directional", one or more grain boundaries necessarily develop, which nullifies the advantages of the monocrystals.

The monocrystalline structure is applied in the form of thin layers, plates or complex forms of approximately one millimeter or a fraction of a millimeter, layer by layer one on top of the other.

If the substrate is brought to a pre-heating temperature, for example by blind tracking, i.e. without a material feed, by the laser or inductively, in the range of 600° C. to 1100° C. and this temperature is maintained for example during the build-up, the stresses in the substrate and in the built-up monocrystal, but also between the substrate and the crystalline structure epitaxially built up on it, are reduced, which contributes to preventing recrystallization and creep in the crystal structure.

Stress-relief annealing of the substrate and newly built-up monocrystalline layer for approximately one hour at a temperature in the range from approximately 1000° C. to 1250° C., for CMSX-4 at about 1150° C., and subsequent slow cooling reduces internal stresses which could lead to destruction of the monocrystalline structure by recrystallization and creep. The stress-relief annealing could, however, also take place immediately after the application of the epitaxial layer with an HF device.

The so-called G-V diagram is different for different metals and metal alloys and can be calculated or experimentally determined for each alloy. The curve L in the G-V diagram separates the range of the two parameters, solidification rate and temperature gradient, in which the alloy globulitically solidifies from that in which the alloy solidifies to form a dendritically directional structure. A description and explanation of the G-V diagram can be found for example in Material Science Engineering Volume 65 1984, in the publication J. D. Hunt concerning "Columnar to Equiangular Transition".

BRIEF DESCRIPTION OF THE DRAWINGS

Exemplary Embodiments are Shown in the Figures

DETAILED DESCRIPTION OF INVENTION

Figure 1:
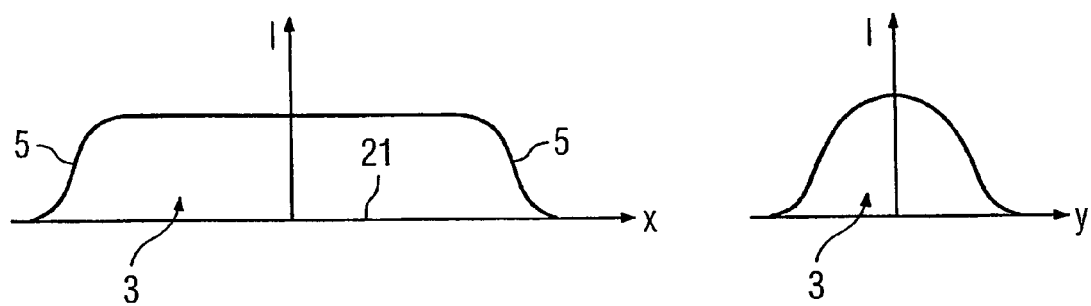
Figure 2:
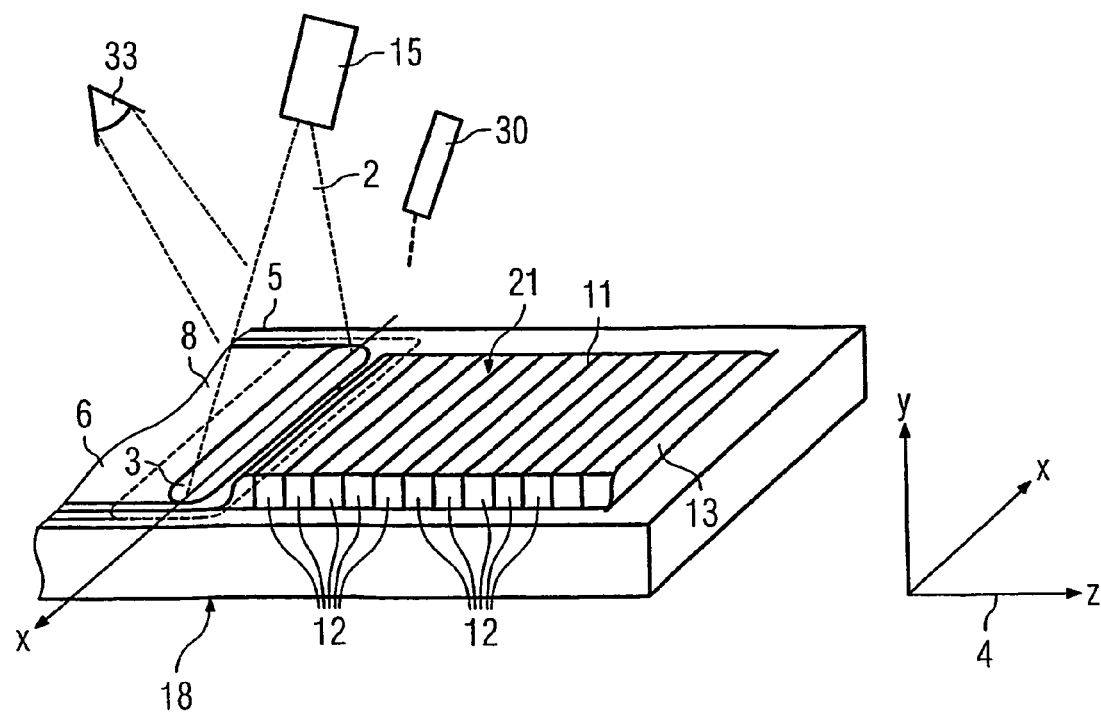
Figure 3:
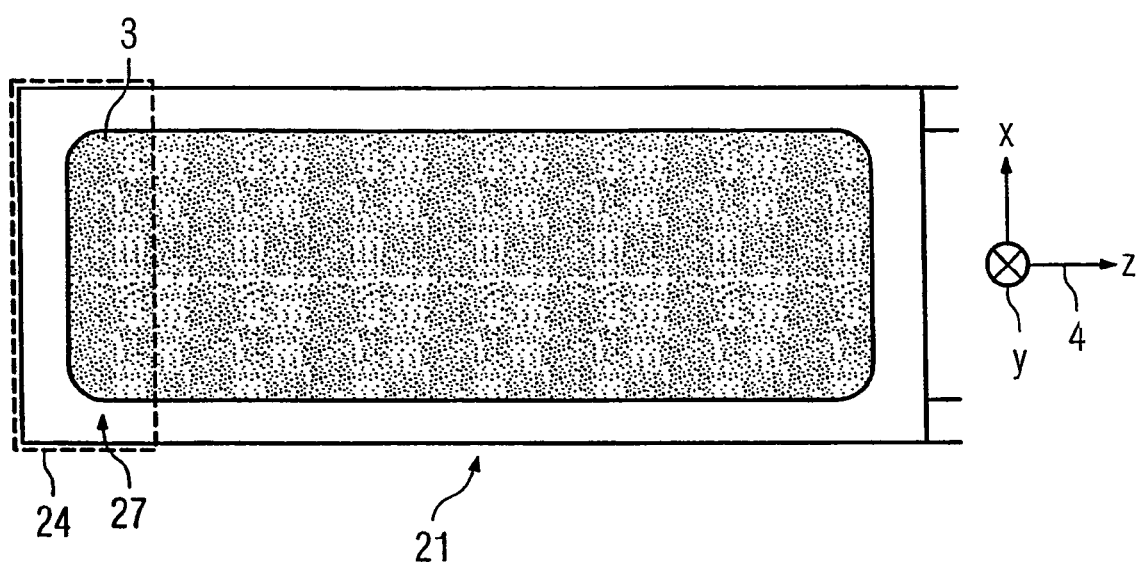
Figure 4:
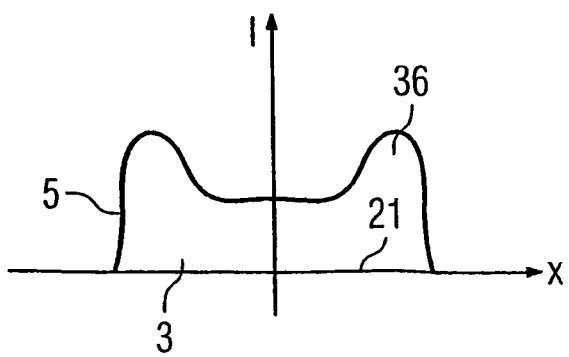
Figure 5:
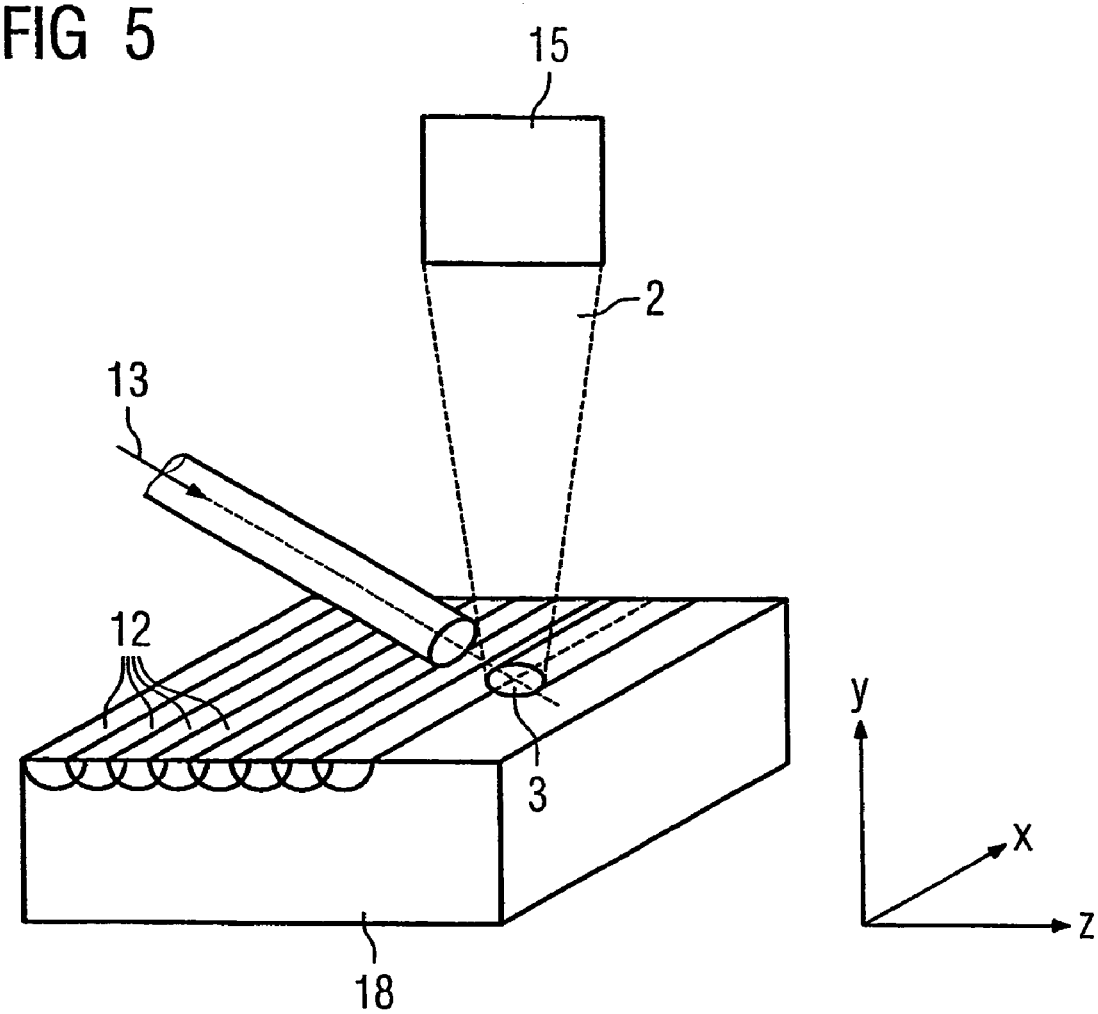

FIG. 1 shows an intensity distribution in cross sections of a focal spot which is used for the method according to the invention, FIG. 2 a focal spot on a component for which the method according to the invention is used, FIG. 3 a beam spot and the focal spot, FIG. 4 an intensity distribution in a cross section of a focal spot which is used for the method according to the invention, and FIG. 5 a method sequence according to the prior art.

FIG. 1 shows the intensity distribution of the beam 2 (FIG. 2) of an energy source in a focal spot 3 in a plane, the said spot not being circular but formed with different widths in the x and y directions.

The x direction is referred to hereafter as the width. The z direction corresponds to a direction of advancement 4 (FIG. 2). The plane (x-z plane) corresponds to the surface 21 to be treated of a component 6 (FIG. 2).

In the x direction, the beam 2 has, for example, a virtually rectangular profile of the intensity distribution. At the profile ends 5 of the beam in the x direction there is for example a curved transition, which is caused for example by technical reasons. In the x direction there may also be a virtually rectangular profile.

In the y direction, the intensity distribution of the focal spot 3 has for example a substantially inversely parabolic form, which is also caused for example by technical reasons.

In the y direction, there may also be a virtually rectangular profile.

FIG. 2 shows the focal spot 3, which is produced on the component 6 by an energy input by means of the beam 2 of the energy source 15.

The component 6 has a substrate 18.

The substrate 18 has for example a directionally solidified structure. The focal spot 3 is made to pass over the component 6 at a specific speed in the direction of advancement 4 (z direction) on a strip 5 (area on which material 13 is/has been applied, indicated by a line).

Material 13 is fed via a material feed 30, for example in the form of powder. A number of material feeds 30 may also be used.

The material feed 30 may vary the feed of material 13 in terms of time and location and also its composition.

The substrate 18 is for example included in the melting and remelting on a surface 21 of the component 6 to be treated.

Material 13, for example in the form of wire, metal sheet or powder, is fed to this liquid, molten pool.

The fed material 13, which may have a monocrystalline or polycrystalline structure, is introduced into the melted base material in the remelting zone and melted completely.

This fed material 13, that is to say for example the melted powder, can then solidify to form a layer in the form of a monocrystal or a monocrystalline structure with monocrystalline dendrites, i.e. to form a dendritic monocrystal. However, material 13 may also already be present on the surface 21 before the melting, and then be melted with part of the surface 21 of the substrate 18.

There are therefore areas 8 of the component 6 which have already been treated by means of the method according to the invention.

In the direction of advancement 4 of the laser beam 2 there are still areas 11 which have yet to be produced by means of the method according to the invention.

In this area 11, material 13 is applied or is added, is melted and solidifies in a way corresponding to the method according to the invention. The fed material 13, which may have a monocrystalline or polycrystalline structure, is brought into the area of the focal spot 3 and melted completely.

Similarly, the surface 21 of the component 6 on which the material 13 is melted is at the same time heated.

The focal spot 3 with its, for example, approximately rectangular cross-sectional surface area is made to pass in the direction of advancement 4 over the material 13.

The width (x direction) of the focal spot 3 is adapted for example to the width of the area which the material is intended to fill and is approximately as wide as the extent of the filling material 13 in the x direction, so that a complete pass over the surface 21 to be treated takes place in a single continuous advancing movement for the application of a coherent layer of material 13.

The focal spot 3, and consequently also the melted area, may similarly be formed in such a way that it is linear (i.e. very narrow when measured in the longitudinal extent) or elliptical.

Such focal spots 3 can be obtained for example from slab lasers.

Further possibilities for producing this suitable focal spot geometry are provided by arranging optical fibers (fiber arrays), suitable beam transformation optical systems, diode stacks and possibly compacting optical systems, for example decidedly funnel-shaped optical systems.

In the lateral marginal areas 5 of the beam cross section, no material 13 is introduced.

The wider the central area of the rectangular focal spot 3 is, the wider the bead formed by the applied material 13 becomes.

The width can be varied by suitable measures. This takes place for example by means of corresponding optical systems of the laser 15.

Material 13 is applied for example in powder form in lines 12 along the x direction. All the lines 12 form the bead, that is to say a layer to be newly formed on the substrate 18.

According to the prior art, the beam 2 is moved back and forth in the x direction in a meandering manner for each line 12 and only then moved step by step in the direction of advancement 4 (z direction). With the method according to the invention it is possible to dispense with the meandering back and forth movement. This also simplifies the beam guidance or the movement of the energy source 15 or of the component 6.

Furthermore, the conduction may be controlled in such a way that the power density in the central area of the focal spot 3 remains constant. In this way, beads of different or variable width can be generated during the movement of the focal spot 3.

The method according to the invention allows wide weld beads to be epitaxially applied. By repetition of the method, structures of any desired thickness can be built up layer by layer, one bead at a time, without the material properties being reduced by overlapping laterally, i.e. along the x direction.

It should be noted that a precondition for the growing of a monocrystalline layer is that the fed material 13 is melted completely. If this is not the case, powder grains that are not melted completely for example form crystallization nuclei for dendrites and crystals, which disturb and destroy the monocrystalline growth of the structure.

When building up a relatively large structure, or a relatively large body, by the epitaxial method, globulitic regions form on the surface of the layer last produced. These "equiaxed grains" are nuclei which disturb or interrupt the directional growth of the crystals.

When building up the next layer, lying on top of the last, it is accordingly of great importance that these globulites are melted completely, so that dendrites which would destroy the monocrystalline structure disappear or do not occur at all under the surface.

Other superalloys with which monocrystalline structures can be built up on the basis of the method of the present invention are, for example, IN 738LC, IN 939, IN 100, B 1914, CM 99, SRR 99, CM-247 LC, CMSX-2, CMSX3, CMSX-6, Mar-M002.

The method, for example with an electron beam as the energy source, is carried out in a vacuum. The method can also be carried out in a vacuum with a laser as the energy source. Although no inert gas is required in a vacuum, the manipulation of the energy source, substrate and material to be fed can cause problems.

A temperature control can be performed by means of an optical system 33, which determines when the next epitaxial layer is to be formed.

FIG. 3 shows the irradiated area 24, which is covered by the energy beam 2 (enclosed by broken lines).

The area 24 is made to pass over the surface 21.

There is then an inner area (gray), which shows the entire focal spot 3 produced, created by passing over of the energy beam, and an outer area 27, which was indeed irradiated by the energy beam 2, but where the energy was too low to produce a focal spot 3 (material melted).

At the smaller extreme ends of the focal spot 3, a uniform, constant energy distribution is achieved.

This is not the case with the previously customary circular focal spots.

The rectangular focal spot 3 is consequently adapted to the contour of the area to be melted.

By suitable adjustable or controllable optical systems, the beam cross section can be set to the desired width during the treatment.

Similarly, the laser power can be adapted at the same time by a computer.

A further optical system, arranged in front for example, can sense the optimal width of the area to be melted and pass it on in situ to the energy source 15, i.e. it can be sensed how wide the focal spot 3 must be.

In particular, in this way an overlap of adjacently arranged areas 8 can be avoided. The touching of an area which has already grown in a crystalline manner by a melted area can lead to misorientation. This can be avoided with the method according to the invention, in that the area to be filled with material 13 on the surface 21 is filled by a single movement in the z direction. In the y direction, the method can be repeated a number of times; that is to say that application and melting takes place layer by layer.

If appropriate, an overlap is also possible if the lines 12 are passed over in the x direction, as in the prior art. However, a uniform, constant energy distribution in the x direction is achieved at the smaller extreme ends of the focal spot 3 by the focal spot 3 according to the invention in comparison with the prior art.

The laser with its laser wavelength is selected such that the workpiece strongly absorbs and/or more weakly reflects the energy of the laser beam. This is the case for example with Nd:YAG lasers with a wavelength of 1.06 µm and with high-power diode lasers (0.81 µm; 0.94 µm).

FIG. 4 shows a further intensity distribution of the beam (focal spot 3) in the x direction.

In the x direction, the focal spot 3 has at the profile ends 5 an increase 36 in the intensity of the energy input of the energy source 15 as compared with the middle area of the focal spot 3.

It is possible in this way to compensate for surface stress effects.

FIG. 5 shows the method sequence according to the prior art.

In the case of the method according to the prior art, a layer of the material to be applied is applied transversely in relation to the length (in the x direction) of the surface (11) to be treated, in each case in narrow adjacent strips (12) which correspond the area of the surface to be treated. This results in overlapping or touching of individual weld beads (strips on which new material adjacently grows), which because of the geometrical conditions lead to non-epitaxial growth with insufficient crystal orientation.

The round laser beam 2 produces a round focal spot 3. The laser beam 2 consequently moves repeatedly back and forth in the x direction and forward step by step in the z direction.

The invention claimed is:

1. A method for producing monocrystalline structures, components or workpieces on substrates comprising:
   providing epitaxial growth;
   melting a surface of the component by an energy input of an energy source by a focal spot of the energy source, the focal spot having a geometry with a width and a length in a direction of movement of the focal spot transverse to the width that is less than the width;
   controlling a power intensity at opposed ends of the width of the focal spot to be greater than a power intensity in a central area of the width of the focal spot;
   feeding material to a molten area; and
   melting the fed material with the surface, whereby the molten material is
   introduced into the monocrystalline structure to solidify.

2. The method as claimed in claim 1, wherein the temperature of the focal spot of the energy source is controlled by an optical system.

3. The method as claimed in claim 1, wherein the energy input takes place by a laser.

4. The method as claimed in claim 1, wherein the energy input takes place by electron beams.

5. The method as claimed in claim 1, wherein the focal spot produces a molten area with a substantially linear, elliptical or rectangular geometry.

6. The method as claimed in claim 1, wherein the monocrystalline structures, components or workpieces are produced from metal superalloys.

7. The method as claimed in claim 1, wherein the substrate having a monocrystalline structure or monocrystalline structures.

8. The method as claimed in claim 1, wherein the width of the focal spot is controlled so that a complete pass over a surface to be treated takes place in a single continuous advancing movement.

9. A method for producing monocrystalline structures, components or workpieces on substrates, comprising:
   providing a monocrystalline layer;
   melting a surface of the monocrystalline layer by an energy input of an energy source by a focal spot of the energy source having a geometry with a width sufficiently wide to melt a desired width of the surface to be melted and a length in a direction of movement of the focal spot transverse to the width that is less than the width;
   advancing the focal spot in a single continuous movement in the direction transverse to the width only;
   controlling a temperature of the melted surface by controlling the energy source;
   feeding material to the melted surface; and
   melting the fed material completely, whereby the molten fed material is introduced into the monocrystalline layer to solidify;
   wherein the width of the focal spot is changed during operation in response to a sensed width of the surface to be melted.

10. The method as claimed in claim 9, wherein the monocrystalline structures, components or workpieces are produced from metal superalloys.

11. The method as claimed in claim 9, wherein the substrate having a monocrystalline structure or monocrystalline structures.

12. A method for producing monocrystalline structures, components or workpieces on substrates, comprising:
   providing a monocrystalline layer;
   melting a surface of the monocrystalline layer by an energy input of an energy source by a focal spot of the energy source having a geometry with a width sufficiently wide to melt a desired width of the surface to be melted and a length in a direction of movement of the focal spot transverse to the width that is less than the width;
   advancing the focal spot in a single continuous movement in the direction transverse to the width only;
   controlling a temperature of the melted surface by controlling the energy source;
   feeding material to the melted surface; and
   melting the fed material completely, whereby the molten fed material is introduced into the monocrystalline layer to solidify;
   wherein the focal spot has profile ends, and the intensity of the energy input is increased at the profile ends as compared with the middle area of the focal spot.

13. A method for producing monocrystalline structures, components or workpieces on substrates, comprising:
   providing a monocrystalline layer;
   melting a surface of the monocrystalline layer by an energy input of an energy source by a focal spot of the energy source having a geometry with a width sufficiently wide to melt a desired width of the surface to be melted and a length in a direction of movement of the focal spot transverse to the width that is less than the width;
   advancing the focal spot in a single continuous movement in the direction transverse to the width only;
   controlling a temperature of the melted surface by controlling the energy source;
   feeding material to the melted surface; and
   melting the fed material completely, whereby the molten fed material is introduced into the monocrystalline layer to solidify;
   further comprising:

moving the focal spot over the substrate in a direction of advancement wherein the substrate has an area to which material is added; and adapting the focal spot to the geometry of the area such that the width of the focal spot is adapted to a width of the area transversely in relation to the direction of advancement.

14. The method as claimed in claim 13, wherein the focal spot produces a molten area with a substantially linear, elliptical or rectangular geometry.

15. The method as claimed in claim 14, wherein the focal spot produces a molten area with a substantially rectangular geometry.

16. A method for producing monocrystalline structures, components or workpieces on substrates, comprising:

providing a monocrystalline layer;

melting a surface of the monocrystalline layer by an energy input of an energy source by a focal spot of the energy source having a geometry with a width sufficiently wide to melt a desired width of the surface to be melted and a length in a direction of movement of the focal spot transverse to the width that is less than the width;

advancing the focal spot in a single continuous movement in the direction transverse to the width only;

controlling a temperature of the melted surface by controlling the energy source;

feeding material to the melted surface; and melting the fed material completely, whereby the molten fed material is introduced into the monocrystalline layer to solidify;

wherein the energy input takes place by a laser;

further comprising;

moving the focal spot over the substrate in a direction of advancement wherein the substrate has an area to which material is added; and adapting the focal spot to the geometry of the area such that the width of the focal spot is adapted to a width of the area transversely in relation to the direction of advancement.

17. A method for producing monocrystalline structures, components or workpieces on substrates, comprising:

providing a monocrystalline layer;

melting a surface of the monocrystalline layer by an energy input of an energy source by a focal spot of the energy source having a geometry with a width sufficiently wide to melt a desired width of the surface to be melted and a length in a direction of movement of the focal spot transverse to the width that is less than the width;

advancing the focal spot in a sinale continuous movement in the direction transverse to the width only;

controlling a temperature of the melted surface by controlling the energy source;

feeding material to the melted surface; and melting the fed material completely, whereby the molten fed material is introduced into the monocrystalline layer to solidify;

wherein the energy input takes place by electron beams;

further comprising:

moving the focal spot over the substrate in a direction of advancement wherein the substrate has an area to which material is added; and adapting the focal spot to the geometry of the area such that the width of the focal spot is adapted to a width of the area transversely in relation to the direction of advancement.

* * * * *